US007870452B2

(12) United States Patent
Souef et al.

(10) Patent No.: US 7,870,452 B2
(45) Date of Patent: Jan. 11, 2011

(54) SCAN TESTING METHODS

(75) Inventors: Laurent Souef, Montauroux (FR); Didier Gayraud, Nice (FR)

(73) Assignee: NXP B.V., Eindhoven (NL)

( * ) Notice: Subject to any disclaimer, the term of this patent is extended or adjusted under 35 U.S.C. 154(b) by 464 days.

(21) Appl. No.: 12/065,935

(22) PCT Filed: Sep. 7, 2006

(86) PCT No.: PCT/IB2006/053142

§ 371 (c)(1),
(2), (4) Date: Mar. 11, 2008

(87) PCT Pub. No.: WO2007/029190

PCT Pub. Date: Mar. 15, 2007

(65) Prior Publication Data

US 2008/0250288 A1 Oct. 9, 2008

(30) Foreign Application Priority Data

Sep. 8, 2005 (EP) .................................. 05300728

(51) Int. Cl.
*G01R 31/28* (2006.01)
(52) U.S. Cl. .................. 714/731; 714/727; 714/729
(58) Field of Classification Search .............. 326/3; 713/600; 714/728, 733, 731, 735, 744, 727, 714/729

See application file for complete search history.

(56) References Cited

U.S. PATENT DOCUMENTS

| 4,594,711 | A | * | 6/1986 | Thatte | 714/728 |
| 5,126,598 | A | * | 6/1992 | Kotani | 326/3 |
| 6,591,388 | B1 | | 7/2003 | Vonreyn | |
| 6,681,359 | B1 | * | 1/2004 | Au et al. | 714/733 |
| 6,789,220 | B1 | * | 9/2004 | Lovejoy | 714/733 |
| 7,330,994 | B2 | * | 2/2008 | Frederick | 713/600 |
| 2004/0163021 | A1 | | 8/2004 | Nadeau-Dostie | |
| 2005/0193299 | A1 | | 9/2005 | Saado et al. | |

FOREIGN PATENT DOCUMENTS

WO 0201719 A2 1/2002

* cited by examiner

*Primary Examiner*—David Ton

(57) ABSTRACT

A method of testing an integrated circuit, comprises providing a test vector to a shift register arrangement by providing test vector bits in series into the shift register arrangement (20) timed with a first, scan, clock signal (42). The test vector bits are passed between adjacent portions of the shift register arrangement timed with the first clock signal (42) and an output response of the integrated circuit to the test vector is provided and analyzed. The output response of the integrated circuit to the test vector is provided under the control of a second clock signal (56) which is slower than the first clock signal. This testing method speeds up the process by increasing the speed of shifting test vectors and results into and out of the shift register, but without comprising the stability of the testing process. Furthermore, the method can be implemented without requiring additional complexity of the testing circuitry to be integrated onto the circuit substrate.

12 Claims, 5 Drawing Sheets

SCAN TESTING METHODS

The present invention generally relates to testing of semiconductor integrated circuits during manufacture and, more particularly, to the testing of combinatorial logic arrays using scan testing techniques.

Scan testing techniques essentially involve launching a test pattern (termed "vector") into the pins of a device package and monitoring an output response at a specific time, dependent on the clock speed of the device. A set of test vectors is used to enable the behaviour of the device under test to be determined. These vectors are designed to enable detection of manufacturing defects in the device.

Increased integration density has greatly increased the functionality, performance and economy of manufacture of integrated circuit devices due to the increased number of active elements which may be placed in greater proximity on chips simultaneously formed on a wafer. However, freedom from manufacturing defects must be ascertained by propagating a sufficient number of different vectors through the device to be able to determine that the device will perform correctly for all operating conditions.

For relatively simple circuits that involve relatively few inputs and relatively few dependencies on prior execution cycles, a relatively small and simple test program may be constructed to ascertain freedom from manufacturing defects. However, with the increased functionality of integrated circuit devices and the corresponding increase in number of inputs and dependencies on numerous prior execution cycles, the number of test vectors required increases dramatically, with a corresponding increase in required test time. The required testing time can become prohibitive.

FIG. 1 shows in simplified form one example of scan testing hardware.

The device under test comprises combinatorial logic 10 which determines the circuit response to input parameters. The logic unit 10 has primary inputs 12 and outputs 14, exceptions are power lines and clock lines, which do not need to be subject to the scan testing procedure.

The testing hardware comprises a shift register 20 comprising a chain of scan flip flops 22, only four of which are shown for simplicity. The flip flops are clocked by a scan clock 24 which times the propagation of a test vector into the register from a scan input 26. The shift register essentially functions as a serial to parallel converter, and receives serial data for the vectors at the scan input 26.

Each flip flop has two inputs, and the input signal which is propagated to the output is dependent on a scan enable signal 28. The scan enable signal enables a set of outputs from the logic unit 10 to be propagated through the flip-flops. Thus, the circuit operates to shift in a scan vector, which is then applied in parallel to the logic unit 10. The outputs from the logic unit 10 are then provided to the shift register under the control of the scan enable signal, as a parallel vector. Once in the shift register, this output vector is propagated out of the shift register in serial manner to the output 29. Simultaneously, a new scan vector can be provided into the shift register.

Each flip flop can be implemented as a D-type flip flop with a mutiplexer at the D input. The multiplexer controls which of the two inputs is provided to the flip flop D input based on the scan enable signal. FIG. 2 shows the flip flop design, comprising a flip flop 30 and a multiplexer 32.

The serial output is compared with the expected output to determine whether or not the correct circuit function is being implemented by the combinatorial logic.

FIG. 3 shows the timing of the operation of the shift register circuit of FIG. 1.

The scan in plot 40 represents the serial scan vectors, and the bits of the scan vector are timed with the scan clock 42. During time period 44, a scan vector is propagated into the shift register. During time period 46 the scan enable line is toggled (plot 43) so that the scan clock pulse within the period 46 results in the output vector from the logic unit being coupled into the shift register. This time period 46 may be considered as a "Capture Cycle", and the combinatorial logic is operated in normal mode during this clock cycle so that the response to the logic to the input can be tested. During time period 48, the output from the logic is shifted out of the register and a new vector is provided simultaneously. Plot 50 is the scan out signal.

During the capture cycle 46, the scan in signal is not used as shown by hatched area 52 (the last shifted value may be kept, but this is not essential).

There is a limit to the speed at which the scan test cycle can operate, and this limit manifests itself as a maximum frequency of the scan clock signal 42. For example, the maximum clock signal frequency may be approximately 10 MHz. This limit is in particular determined by the need to ensure the logic has responded to the vector input, and that the response output vector is correctly propagated into the shift register.

U.S. Pat. No. 6,591,388 discloses a scan test system in which the speed of propagation of a test vector into and out of a shift register arrangement is increased by providing multiple shift register chains in parallel, and using higher speed additional shift registers to control the inputs and outputs from the chains, functioning as multiplexers and demultiplexers.

According to the invention, there is provided a method of testing an integrated circuit, comprising:

providing a test vector to a shift register arrangement by providing test vector bits in series into the shift register arrangement timed with a first, scan, clock signal, and propagating the test vector bits between adjacent portions of the shift register arrangement timed with the first clock signal;

providing the test vector from the shift register arrangement to terminals of the integrated circuit;

providing an output response of the integrated circuit to the test vector to the shift register arrangement as parallel output response bits, under the control of an enable signal;

propagating the output response bits between adjacent portions of the shift register arrangement timed with the first clock signal and outputting the output response out of the shift register arrangement in series timed with the first clock signal; and analyzing the output response to test the integrated circuit function, wherein the output response of the integrated circuit to the test vector is provided under the further control of a second clock signal which is slower than the first clock signal.

This testing method speeds up the process by increasing the speed of shifting test vectors and results into and out of the shift register, but without comprising the stability of the testing process. Furthermore, the method can be implemented without requiring additional complexity of the testing circuitry to be integrated onto the circuit substrate.

The portions of the shift register preferably comprise flip flops.

The first and second clock signals can comprise a single signal having at least first and second portions with different clock rates, the first and second portions defining the first and second clock signals. Thus, the number of control signals required to implement the testing process is not increased, and again the testing equipment hardware does not need to be modified to enable it to select between multiple clock signals on different lines.

The method may further comprise providing a setup period between the end of the first clock signal portion and the beginning of the second clock signal portion, the enable signal having a transition during the setup period.

This measure allows delays in the provision of the beginning of the enable signal to the shift register latches to be tolerated. During the setup period, the test vector is provided from the shift register arrangement to the terminals of the integrated circuit. This means the logic can perform the function being tested during this time. The duration of the setup period may for example correspond substantially to one clock cycle of the second clock signal portion.

The method may further comprise providing an end period between the end of the second clock signal portion and the beginning of the next first clock signal portion, the enable signal having a transition during the end period.

This measure allows delays in the provision of the end of the enable signal to the shift register latches to be tolerated. Again, during the setup period, the test vector is provided from the shift register arrangement to the terminals of the integrated circuit and the duration of the end period may again correspond substantially to one clock cycle of the second clock signal portion.

The invention also provides a system comprising an integrated circuit and a testing apparatus, the integrated circuit comprising:
 combinatorial logic; and
 integrated test circuitry to enable testing of the combinatorial logic, the integrated test circuitry comprising a shift register arrangement for receiving a test vector as test vector bits in series, and connections between inputs and outputs of the shift register arrangement and terminals of the combinatorial logic,
 wherein the system further comprises:
 means for generating a first, scan, clock signal for timing the propagation of the test vector bits between adjacent portions of the shift register arrangement;
 means for generating an enable signal to control the provision of an output response of the combinatorial logic to the shift register arrangement as parallel output response bits,
 wherein the first clock signal is also for timing propagation of the output response bits between adjacent portions of the shift register arrangement and output of the output response from the shift register arrangement,
 and wherein the system further comprises means for generating a second clock signal which is slower than the first clock signal, for controlling the provision of the output response of the integrated circuit to the shift register arrangement.

The signal generation may be part of the testing apparatus.

The invention also provides a computer program for performing the steps of the method of the invention.

An example of the invention will now be described in detail with reference to the accompanying drawings, in which.

The invention relates to a method of testing an integrated circuit in which different speed clocking signals are used for shifting test vectors and results into and out of a shift register as for obtaining test results from the circuitry being tested. This enables design speed limits to be increased, whilst still taking account of propagation delays in the circuit being tested.

Figure 1:
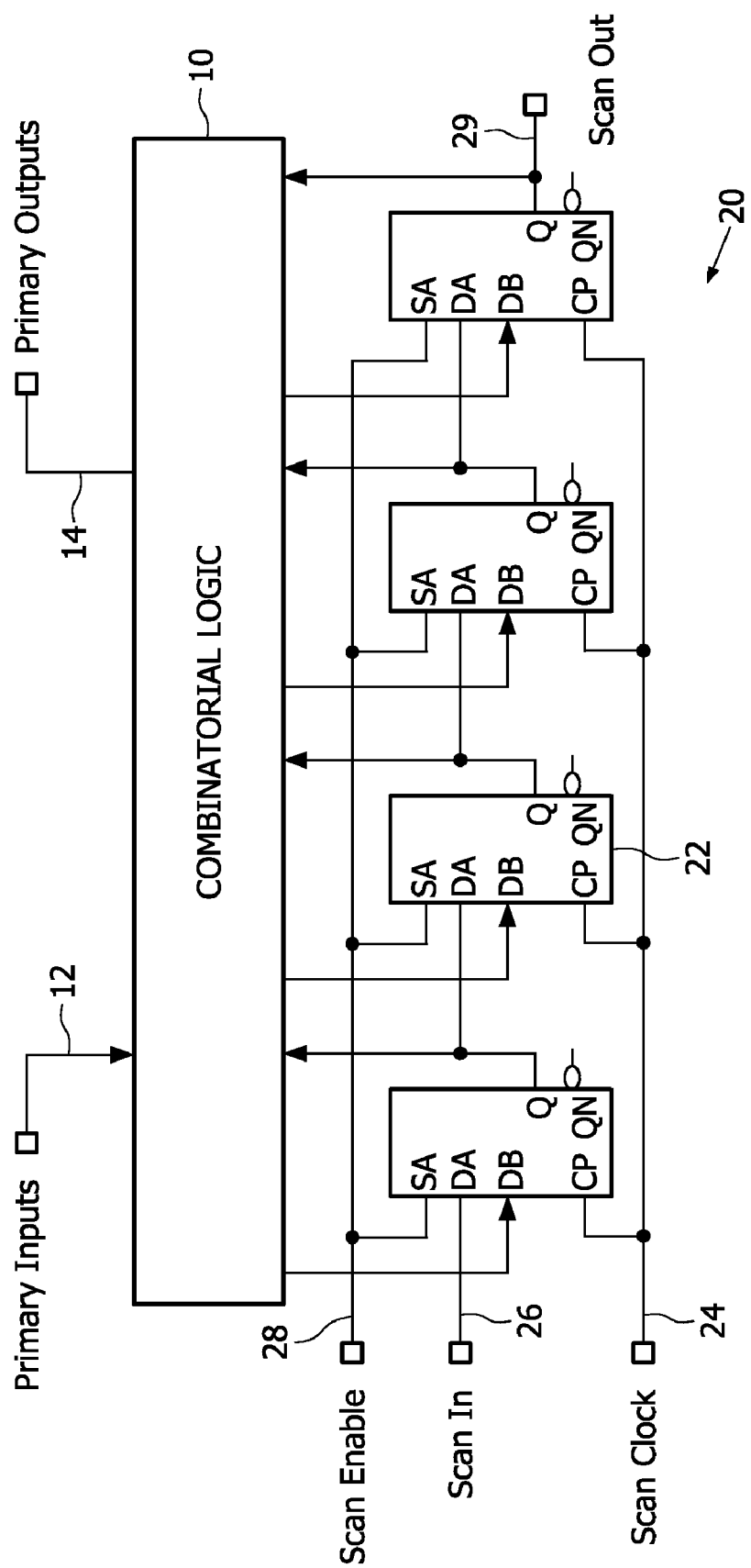
FIG. 1 shows a known testing circuit for integration with an integrated circuit.
Figure 2:
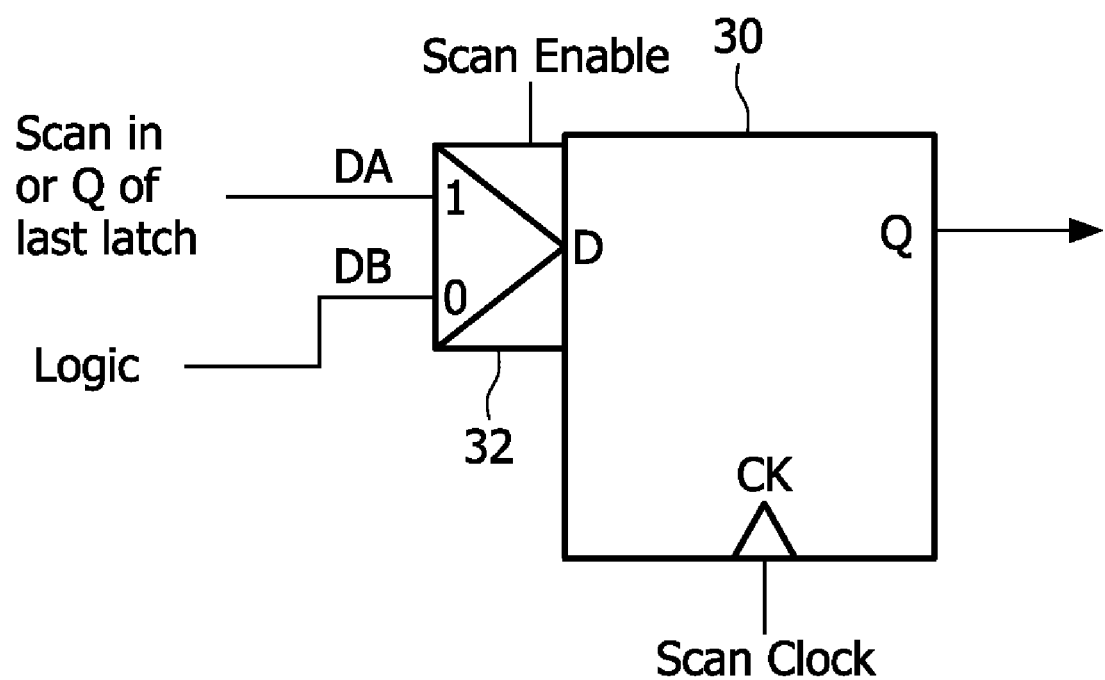
FIG. 2 shows one latch element of the circuit of FIG. 1 in more detail.

The invention is based on the recognition of a number of factors which influence the maximum speed at which a vector based testing circuit, such as the circuit of FIG. 1, can be operated. These factors will be discussed before describing the invention.

There are essentially four limitations to the speed at which the circuit can be operated.

(i) The required time delay between the test vector being made available to the logic circuit and the result data being ready for propagation through the shift register (path of Q to DB through the logic unit 10 in FIG. 1). Insufficient delay can result in the capture of incorrect data during the Capture Cycle 46.

Figure 3:
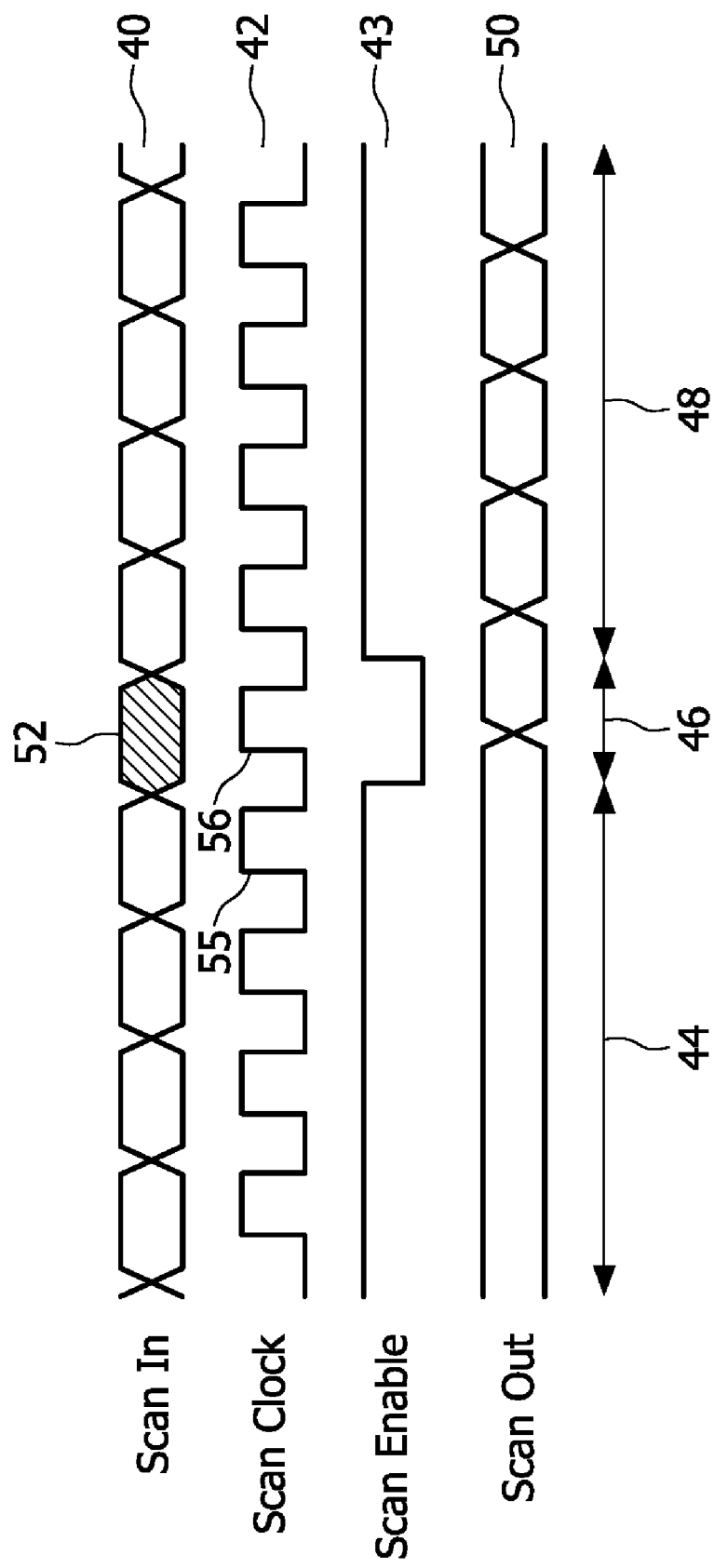
FIG. 3 is a timing diagram used to explain the known operation of the circuit of FIG. 1.

The rising edge of the Scan Clock signal during the last cycle of shifting vector data into the shift register defines the starting point of the time available for providing the test vector to the IC and the processing of the test vector by the IC being tested. This time is shown as 55 in FIG. 3. The next rising edge of the Scan Clock during the Capture Cycle 46 determines the end of the time available for the test vector data to be processed. This timing is shown as 56. This time period (55 to 56) can be shorter than the feedback path (Q to DB) of the flip-flops. This happens when there is a high logic depth in the IC or when the Scan Clock period is shortened too far in an attempt to obtain the high-speed testing. The required time can be determined in advance using modeling tools.

(ii) The possible delay to the Scan Enable signal.

The scan enable signal is often gated and passes through a large number of buffer or inverter gates (high fanout synthesis) before arriving to the flip-flops. This delay, if not well taken into account in advance in the design, can be of several nanoseconds and can impact on the frequency of the high-speed test.

(iii) The possible delay between the scan output and the external test circuitry input. The output of the last flip-flop in the scan chain is often multiplexed with other signals before being provided to the output of the circuitry signal. Indeed, it may pass through a large number of multiplexers before reaching the output pad. This may be required because the output pads may share many test modes, pass through Boundary scan cells and so on. This delay may again constrain the speed of the shift-out operation, again limiting the speed of testing.

(iv) The possible delays on the clock signal. The vector testing requires that all test input signals are present in the correct latches or flip-flops throughout the chip within the same clock cycle. To meet this requirement, a so-called "clock tree" is used to deliver clock signals throughout the chip (substantially) simultaneously. There is of course some variation from exact synchronism between different, separated, regions of the chip, which receive clock signals from different branches of the tree. For large clock trees, the clock latency can be the order of several nanoseconds. When the test period becomes very short, this delay can cause incorrect data capture during the propagation of data through the shift register. In particular, the first flip-flop may capture the data intended to be captured during the previous clock cycle.

Each of these limitations gives rise to a maximum possible clock speed for the testing circuitry. Which of these limitations is dominant will depend on the particular application.

The invention provides an increase in the speed of shifting data along the shift register. A correctly implemented shift register can be operated at significantly higher speeds than the IC circuit clock speed. Furthermore, this shift phase is generally the largest part of the scan test. Typically, the longest scan chain may have of the order of 1000 flip-flops, and the implication of this is that the scan test will shift 1000 cycles for each cycle of test data capture. The invention provides different capture cycle frequency and shift frequency, so that test data capture is at relatively low speed, but shift register propagation is at relatively high speed.

Figure 4:
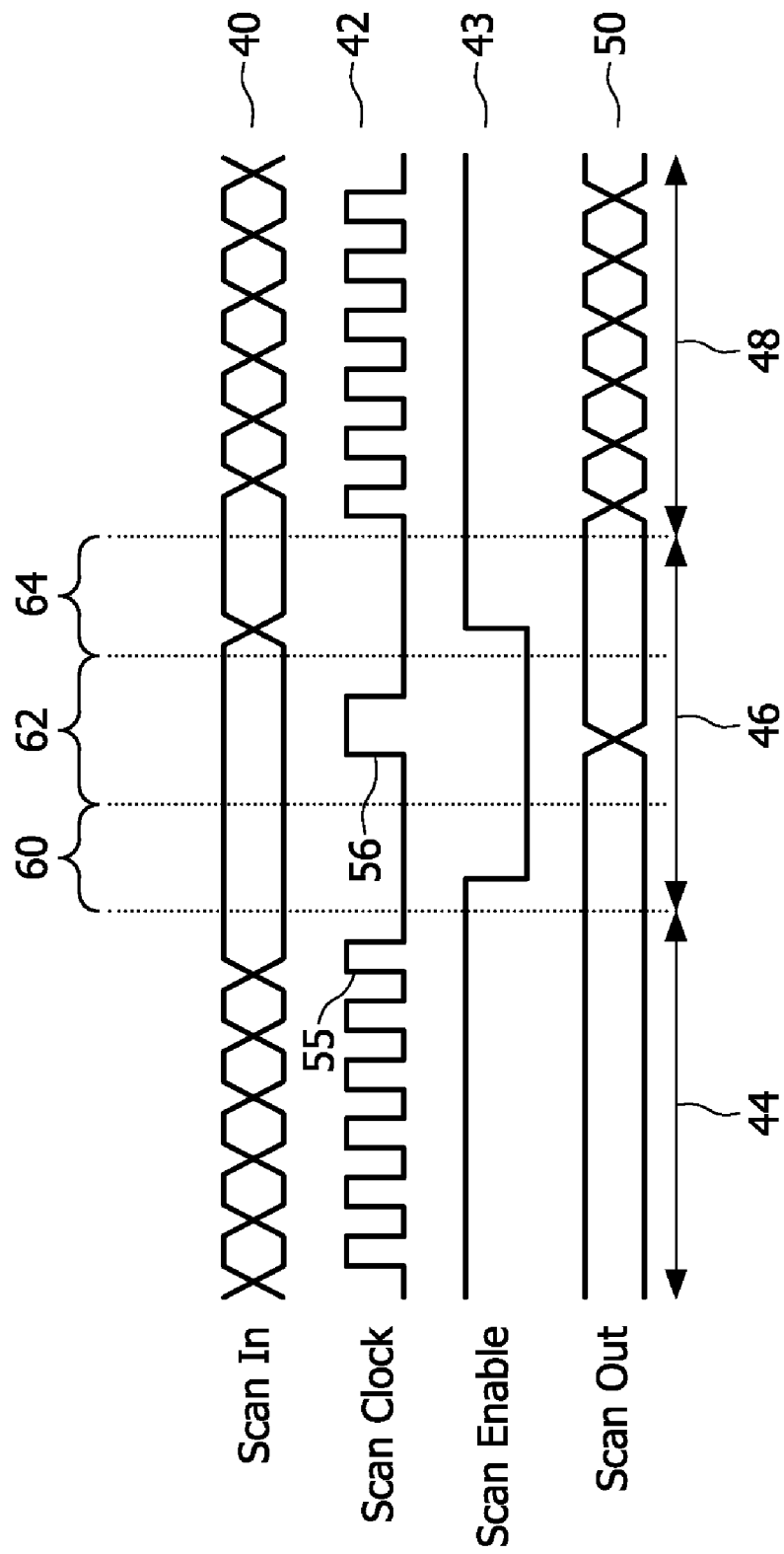
FIG. 4 is a timing diagram used to explain the operation of the circuit of FIG. 1 using the method of the invention.

FIG. 4 shows the timing for the operation of the circuit of FIG. 1 using the method of the invention. The same reference numerals are used as in FIG. 3, and the same variables are plotted.

The Capture Cycle 46 again has a clock pulse for triggering the transfer of data from the logic unit 10 into the shift register. However, this clock pulse is wider than the other pulses of the scan clock, so that the scan clock effectively has two regions of different clock rate. One region may be considered to be a latching clock signal portion and the other is a capture cycle clock signal portion.

The frequency of the clock signal for the capture cycle operation can be determined using Static Timing Analysis (STA) capabilities, and this clock frequency will approach the maximum possible capture frequency possible for the device being tested.

The capture cycle 46 is divided into three sections 60, 62, 64, and the middle section 62 includes the clock pulse.

A section 60 also precedes the scan clock pulse section 62, and this functions as a setup period between the end of the faster latching scan clock signal portion and the beginning of the slower capture cycle clock signal portion. The scan enable signal has a transition during the setup period, and the set up period ensures that any delay in the scan enable line does not affect the testing operation. Effectively, one extra cycle is added between the last latching clock pulse and the capture cycle clock pulse. During this period 60, all of the clock signals are on hold, and only the scan enable line (and the primary inputs) can switch. The latch outputs are masked, so that signals are not measured by the tester during the current cycle, but are measured during the next cycle, and the latch inputs are provided with the output response of the logic to the test vector. This setup period preferably has the duration of one clock cycle of the slower capture cycle clock portion, as shown in FIG. 4.

A section 64 also follows the section 62, and this functions as an end period between the end of the slower capture cycle clock signal portion and the beginning of the faster latching clock signal portion. The scan enable signal has its other transition during the end period 64. Again, during this period, all of the clock signals are on hold, and only the scan enable line (and the primary inputs) can switch. The latch outputs are again masked and the latch inputs are provided with the output response of the logic to the test vector. This setup period preferably also has the duration of one clock cycle of the slower capture cycle clock portion.

The setup and end periods may have different durations, for example based on an integer number of clock cycles of the faster latching clock signal portion.

The clock frequency for the higher speed latching portion can again be determined by Static Timing Analysis (STA), and this frequency will be the maximum intrinsic shift frequency of the shift register latches or flip-flops. This frequency can reach several tens of MHz.

In order to compensate for delays between the last latch or flip-flop of the shift register and the output pad, an additional measure which can be taken is to delay the provision of output data to the next shift cycle. This requires shifting (by a software algorithm) the expected values on the scan out line to the next shift cycle. This may be particularly appropriate when the shift register is terminated with an anti-skew element. This is a flip flop (or latch) element clocked on the negative edge of the scan clock. This is also termed a "lockup latch", and is a well known technique in the Scan Test field for securing clock skew between scan shift registers on different clock tree branches. Some designs end their scan registers using such an element to provide a half clock cycle delay of the scan output signal. If the scan chain is terminated by such an anti-skew element, then the scan output signal will toggle after the negative edge of the clock instead of the rising edge, which leads to the delay of half a clock cycle.

If there are several scan chains, different scan chains can be handled independently. Some scan chains may need to have the outputs shifted by a clock cycle and others may not.

The invention enables the shifting speed to increased by a factor of two, three or more. Practical results show that above 100 MHz (10 ns period) it becomes very difficult to have stable results within the shift registers. This can nevertheless represent a test time reduction of a factor of 10, achieved without changing the combinatorial logic circuit. The invention can be implemented simply by changing the test signal patterns for application to existing hardware.

The delay associated with the clock tree can also be taken into account. Again, STA can be used to determine the maximum latency of the clock tree. If the clock latency is such that a clock pulse can arrive after corresponding the scan in data bit has ended (based on the minimum delay in the arrival of the data from the scan input to the shift register, and the maximum clock latency), then the scan in data can be shifted by one clock cycle. This can be implemented by reordering the test vector data.

The method of the invention can be implemented in software test tools during the scan pattern formatting step. These already have the capability of providing complex waveforms, such as those required for the scan clock and scan in waveforms shown in FIG. 4. The invention can enable the Scan Test Time to be compressed by a factor of approximately 10 compared to current scan techniques, by shifting the latch data at a frequency of the order of 100 MHz (for example 50 MHz-150 MHz, or 60 MHz-120 MHz) compared to conventional 10 MHz scan shifting.

Figure 5:
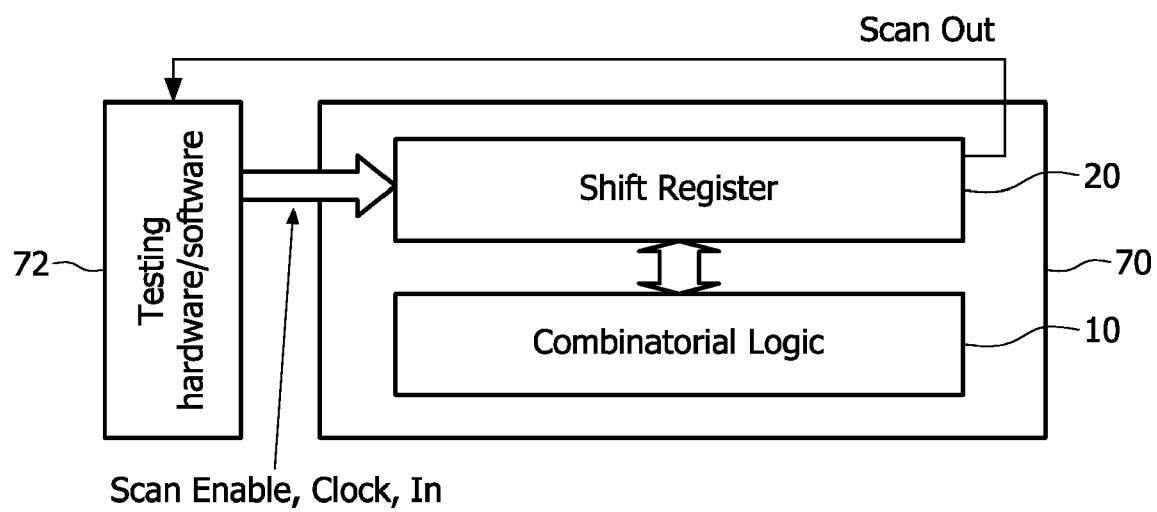
FIG. 5 shows a system of the invention comprising an integrated circuit and a testing apparatus.

FIG. 5 shows a system of the invention, comprising an integrated circuit 70 and a testing apparatus 72. The integrated circuit 70 has the combinatorial logic 10 to be tested and integrated test circuitry 20 in the form of the shift register. The external testing hardware and software 72 generates the hybrid (two-speed) scan clock signal, and the enable signal.

The invention also relates to the software used by the testing equipment 72 to implement the method outlined above.

The example above has the same shift register coupling the scan vector in and the output vector out. This reduces the additional hardware required for test capability, but different shift registers may instead be used. Thus, the shift register arrangement may comprise multiple shift registers.

Only one example of shift register architecture has been shown but many other specific configurations are possible.

Various other modifications will be apparent to those skilled in the art.

The invention claimed is:

1. A method of testing an integrated circuit, comprising:
providing a test vector to a shift register arrangement by
providing test vector bits in series into the shift register arrangement timed with a first, scan, clock signal, and propagating the test vector bits between adjacent portions of the shift register arrangement timed with the first clock signal;

providing the test vector from the shift register arrangement to terminals of the integrated circuit;

providing an output response of the integrated circuit to the test vector to the shift register arrangement as parallel output response bits, under the control of an enable signal;

propagating the output response bits between adjacent portions of the shift register arrangement timed with the first clock signal and outputting the output response out of the shift register arrangement in series timed with the first clock signal; and analyzing the output response to test the integrated circuit function, wherein the output response of the integrated circuit to the test vector is provided under the further control of a second clock signal which is slower than the first clock signal; and wherein the first and second clock signals comprise a single signal having at least first and second portions with different clock rates, the first and second portions defining the first and second clock signals.

2. A method as claimed in claim 1, wherein the method further comprises providing a setup period between the end of the first clock signal portion and the beginning of the second clock signal portion, the enable signal having a transition during the setup period.

3. A method as claimed in claim 2, wherein during the setup period, the test vector is provided from the shift register arrangement to the terminals of the integrated circuit.

4. A method as claimed in claim 2, wherein the duration of the setup period corresponds substantially to one clock cycle of the second clock signal portion.

5. A method as claimed in claim 1, wherein the method further comprises providing an end period between the end of the second clock signal portion and the beginning of the next first clock signal portion, the enable signal having a transition during the end period.

6. A method as claimed in claim 5, wherein during the end period, the test vector is provided from the shift register arrangement to the terminals of the integrated circuit.

7. A method as claimed in claim 5, wherein the duration of the end period corresponds substantially to one clock cycle of the second clock signal portion.

8. A system comprising an integrated circuit and a testing apparatus, the integrated circuit comprising:

combinatorial logic; and integrated test circuitry to enable testing of the combinatorial logic, the integrated test circuitry comprising a shift register arrangement for receiving a test vector as test vector bits in series, and connections between inputs and outputs of the shift register arrangement and terminals of the combinatorial logic, wherein the system further comprises:

means for generating a first, scan, clock signal for timing the propagation of the test vector bits between adjacent portions of the shift register arrangement;

means for generating an enable signal to control the provision of an output response of the combinatorial logic to the shift register arrangement as parallel output response bits, wherein the first clock signal is also for timing propagation of the output response bits between adjacent portions of the shift register arrangement and output of the output response from the shift register arrangement, wherein the system further comprises means for generating a second clock signal which is slower than the first clock signal, for controlling the provision of the output response of the integrated circuit to the shift register arrangement; and wherein the means for generating the first and second clock signals comprises means for generating a single signal having at least first and second portions with different clock rates, the first and second portions defining the first and second clock signals.

9. A system as claimed in claim 8, wherein the means for generating a single signal further comprises means for providing a setup period between the end of the first clock signal portion and the beginning of the second clock signal portion.

10. A system as, claimed in claim 9, wherein the duration of the setup period corresponds substantially to one clock cycle of the first clock signal portion.

11. A system as claimed in claim 8, wherein the means for generating a single signal comprises means for providing an end period between the end of the second clock signal portion and the beginning of the next first clock signal portion, the enable signal having a transition during the end period.

12. A system as claimed in claim 11, wherein the duration of the end period corresponds substantially to one clock cycle of the first clock signal portion.

* * * * *